(12) United States Patent
Scheucher et al.

(10) Patent No.: US 8,349,708 B2
(45) Date of Patent: Jan. 8, 2013

(54) INTEGRATED CIRCUITS ON A WAFER AND METHODS FOR MANUFACTURING INTEGRATED CIRCUITS

(75) Inventors: Heimo Scheucher, Langegg (AT); Guido Dormans, Bemmel (NL); Tonny Kamphuis, Lent (NL)

(73) Assignee: NXP B.V., Eindhoven (NL)

( * ) Notice: Subject to any disclaimer, the term of this patent is extended or adjusted under 35 U.S.C. 154(b) by 392 days.

(21) Appl. No.: 12/668,418

(22) PCT Filed: Jul. 10, 2008

(86) PCT No.: PCT/IB2008/052777
§ 371 (c)(1),
(2), (4) Date: Jan. 9, 2010

(87) PCT Pub. No.: WO2009/007928
PCT Pub. Date: Jan. 15, 2009

(65) Prior Publication Data
US 2010/0181568 A1    Jul. 22, 2010

(30) Foreign Application Priority Data
Jul. 12, 2007    (EP) .................................... 07112372

(51) Int. Cl.
*H01L 21/46*    (2006.01)
*H01L 21/78*    (2006.01)
*H01L 21/301*   (2006.01)

(52) U.S. Cl. ........................................ 438/460; 438/462

(58) Field of Classification Search .......... 438/460–462, 438/E21.599, E23.179
See application file for complete search history.

(56) References Cited

U.S. PATENT DOCUMENTS

| 5,962,862 A | 10/1999 | Evers et al. |
| 5,990,488 A | 11/1999 | Nistler et al. |
| 7,456,489 B2 * | 11/2008 | Scheucher ................ 257/618 |
| 2003/0017631 A1 | 1/2003 | Yamaguchi |

FOREIGN PATENT DOCUMENTS

| JP | 2001 044146 A | 2/2001 |
| TW | 200704737 A | 2/2007 |
| WO | 02/069389 A2 | 9/2002 |
| WO | 2005/064679 A1 | 7/2005 |

* cited by examiner

*Primary Examiner* — Cuong Q Nguyen

(57) ABSTRACT

Integrated circuits (1) on a wafer comprise a wafer substrate (2), a plurality of integrated circuits (1) formed lattice-like in rows and columns on the wafer substrate (2), and first and second saw lines (4, 5) separating the integrated circuits (1). The first saw lines (4) run parallel and equidistant with respect to each other in a first direction (x) defined by the rows and the second saw lines (5) run parallel and equidistant with respect to each other in a second direction (y) defined by the columns. The integrated circuits (1) on the wafer further comprise a plurality of process control modules (3) formed on the wafer substrate (2) such that a given process control module (3) of the plurality of process modules (3) is bounded by two consecutive first saw lines (4) as well as by two consecutive second saw lines (5).

12 Claims, 5 Drawing Sheets

INTEGRATED CIRCUITS ON A WAFER AND METHODS FOR MANUFACTURING INTEGRATED CIRCUITS

FIELD OF THE INVENTION

The invention relates to integrated circuits on a wafer and to methods for manufacturing integrated circuits.

BACKGROUND OF THE INVENTION

Integrated circuits are usually produced by forming a plurality of integrated circuits on a semiconductor wafer substrate by repeatedly exposing the wafer to a reticle mask utilizing a stepper, thereby forming a plurality of exposed areas arranged on the wafer surface. The image of the mask pattern is printed on a resist layer applied on the wafer surface and developed to form a resist pattern used as a mask for, for instance, etching a layer formed on the wafer surface. The integrated circuits are formed by repeating these processes. The individual integrated circuits are separated by saw lines used for a successive separation step.

In addition to the integrated circuits, test devices for measuring electric characteristics are also formed on the wafer substrate. The test devices are usually known as process control modules (PCM), may include active or passive electric devices, such as transistors or resistive tracks, and are usually located within the saw lines.

Published U.S. application for patent No. 2003/0017631 A1 discloses a reticle including a device pattern region, in which a plurality of mask patterns of semiconductor device chips is formed, and including a test element group (TEG) pattern region formed on one side of the device pattern region. The TEG pattern region is provided for arranging patterns of TEGs and alignment marks for the exposing apparatus. The lateral dimension of the TEG pattern region is the same as that of the device pattern region. The width, i.e. the vertical dimension, of the TEG pattern region corresponds to two rows of the semiconductor device chip patterns.

OBJECT AND SUMMARY OF THE INVENTION

It is an object of the present invention to provide integrated circuits on a wafer which allows a simplified further processing particularly during a separation or a pick-and-place step.

The object is achieved in accordance with the invention by means of integrated circuits on a wafer, comprising a wafer substrate, a plurality of integrated circuits formed lattice-like in rows and columns on the wafer substrate, first and second saw lines separating the integrated circuits, wherein the first saw lines run parallel and equidistant with respect to each other in a first direction defined by the rows and the second saw lines run parallel and equidistant with respect to each other in a second direction defined by the columns, and a plurality of process control modules formed on the wafer substrate such that a given process control module of the plurality of process modules is bounded by two consecutive first saw lines as well as by two consecutive second saw lines.

Besides the integrated circuits, process control modules are formed on the wafer substrate. Process control modules, usually abbreviated as PCM, are known per se in the art. Process control modules are test devices for measuring electric characteristics of the wafer. Process control modules may include active or passive electric devices, such as transistors or resistive tracks. The process control modules of the inventive integrated circuits on the wafer are bounded by two consecutive saw lines with respect to both directions. Therefore, the individual process control modules replace each a single integrated circuit. This allows placing the process control modules more flexibly on the wafer substrate, potentially allowing to use the surface of the wafer substrate, on which the integrated circuit are formed, to be used more economically.

When the inventive integrated circuits on the wafer are finished, they have to be separated into individual integrated circuits. This step is usually called die separation, wherein a separation device, such as a laser, is guided along the saw lines. Then, the integrated circuits on the wafer may be placed on a flexible foil and flexed to be separated along the saw lines. The inventive integrated circuits on the wafer can particularly be separated into individual integrated circuits according to the following steps:

providing the inventive integrated circuits on the wafer;

detecting the process control modules on the wafer substrate utilizing an alignment detecting device of a separating device;

aligning the separating device in response to the detected process control modules; and guiding the separating device along the saw lines.

The structure of the process control modules is less complex than the structure of the integrated circuits. Therefore, the process control modules can be distinguished from the integrated circuits and thus can be used for the alignment of the separating device.

The separating device may be guided along the bottom surface of the wafer substrate, i.e. along the surface opposite to the surface on which the integrated circuits are formed. Then, detecting the process control modules for the alignment of the separating device may include utilizing light shining through the bottom surface of the wafer substrate. Since the process control modules are less complex than the integrated circuits, light shining through the bottom surface is less likely to be absorbed completely by the process control than by the integrated circuits. Thus, it likely that sufficient light is reflected by the structure of the process control modules, allowing utilizing the process control modules as alignment marks for the separating device.

Particularly when utilizing the laser, the integrated circuits on the wafer may be placed on a flexible film of a film frame carrier after. Then, the integrated circuits on the wafer are flexed, utilizing, for instance, a bar. Due to the flexing, the integrated circuits on the wafer break along the saw lines.

The process control modules comprise test devices for measuring electric characteristics of the wafer, i.e. the process control modules comprise electric process control devices. These electric process control devices may be contacted by contact bumps which are, for instance, formed in recesses within a passivation layer covering the integrated circuits and the process control modules. Then, the contact bumps of the process control modules may be used for aligning the separation device. As mentioned above, the process control modules are less complex than the integrated circuits. As a result, light shining through the bottom surface of the wafer substrate are likely be absorbed by an inner structure of the integrated circuits preventing utilizing the integrated circuits for aligning the separation device. The process control modules, however, are less complex so that light shining through the bottom surface of the wafer substrate is less likely absorbed by the inner structure of the process control modules. This makes it possible that sufficient light may be reflected by the contact bumps of the process control modules, wherein the reflected light can be used for aligning the separation device.

Before separating the integrated circuits on the wafer into individual integrated circuits, the integrated circuits may be tested and registered as working and non-working integrated circuits. After the separation step, the individual integrated circuits may be placed on the foil of the film frame carrier. Then the working integrated circuits may be picked up from the film frame carrier utilizing a pick-and-place system, which may be aligned utilizing the process control modules.

The structure of the process control modules likely differ from the structure of the integrated circuits so that the process control modules can be distinguished from the integrated circuits. This allows utilizing the process control modules for aligning the pick-and-place system.

Particularly, the contact bumps configured to contact the electric process control devices of the process control modules may be used for aligning the pick-and-place system.

There may be formed on the wafer substrate at least one integrated circuit between at least two or between all process control modules. It is also possible that at least two process control modules are formed on the wafer substrate adjacent to each other.

Especially when utilizing the process control modules for aligning the separating device and/or the pick-and-place system, the process control modules may be placed in a regular manner on the wafer substrate. This may support to enhance the quality of the respective alignments.

The integrated circuits and the process control modules may particularly be formed on the wafer substrate utilizing a reticle. When manufacturing the integrated circuits on the wafer substrate, an area of the wafer substrate corresponding to the reticle is exposed and then the reticle is moved to a further area of the wafer substrate utilizing a stepper. The area exposed by the reticle is an exposure field. Each exposure field comprises rows and columns defined by the first and second saw lines, and each exposure field comprises some of the integrated circuits and some of the process control modules. Since the individual process control modules are formed on the wafer substrate instead of individual integrated circuits, each first and each second saw line is a continuous saw line not interrupted by a process control module. This eases the conditions for a reliable alignment during the production of the integrated circuits on the wafer utilizing the reticle and the stepper.

In order to align the reticle during manufacturing the integrated circuits on the wafer, each exposure field may comprise at least one optical control module formed on the wafer substrate. Optical control modules per se are well known in the art and are in this context alignment marks formed on the wafer substrate and used for automatically aligning the reticle during the process of manufacturing the integrated circuits on the wafer. Optical control modules may be comprised of square, rectangular or cross-shaped interference fields particularly automatically detectable by the stepper used for the reticle. Automatic alignment utilizing the optical control modules may be accomplished by passing low-energy laser beams through alignment marks on the reticle and reflecting them off corresponding alignment marks, i.e. the optical control modules, on the wafer substrate. An optical control module may particularly have a three dimensional structure such that it can be used for each exposure step during the manufacture of the integrated circuits on the wafer.

In one embodiment of the inventive integrated circuits on the wafer, each exposure field comprises a plurality of optical control modules, particularly formed in the four corners of the exposure fields. This may improve alignment of the reticle during forming the integrated circuits on the wafer.

The optical control modules may especially be formed on the wafer substrate instead of integrated circuits. Then, the optical control modules do not interrupt the saw lines, potentially improving the separation of the integrated circuit into individual integrated circuits.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
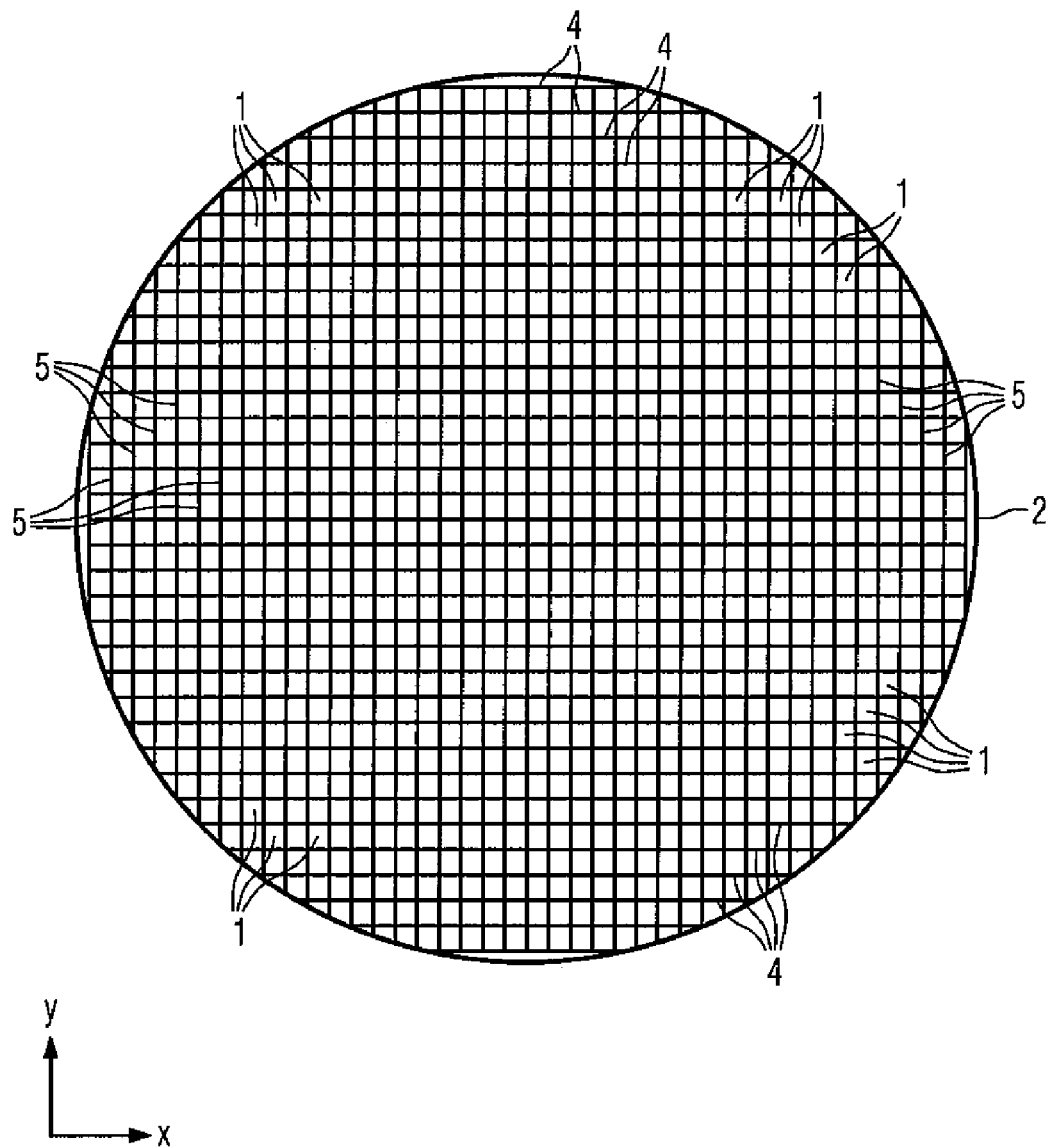
FIG. 1 is a top-view of a plurality of integrated circuits on a wafer.

FIG. 1 shows a top-view of integrated circuits 1 on a semiconductor wafer. The integrated circuits 1 may have been formed on a wafer substrate 2 as it will be explained below.

The integrated circuits 1 on the wafer substrate 2 are separated by first saw lines 4 running parallel in a first direction x and by second saw lines 5 running parallel in a second direction y. The first and second saw lines 4, 5 are each spaced apart such that two consecutive first saw lines 4 are equidistant and two consecutive second saw lines 5 are equidistant. Therefore, the integrated circuits 1 are formed on the wafer substrate 2 in rows running in the first direction x and columns running in the second direction y.

In addition to the integrated circuits 1, process control modules 3 and optical control modules 6 are formed on the wafer substrate 2.

Figure 2:
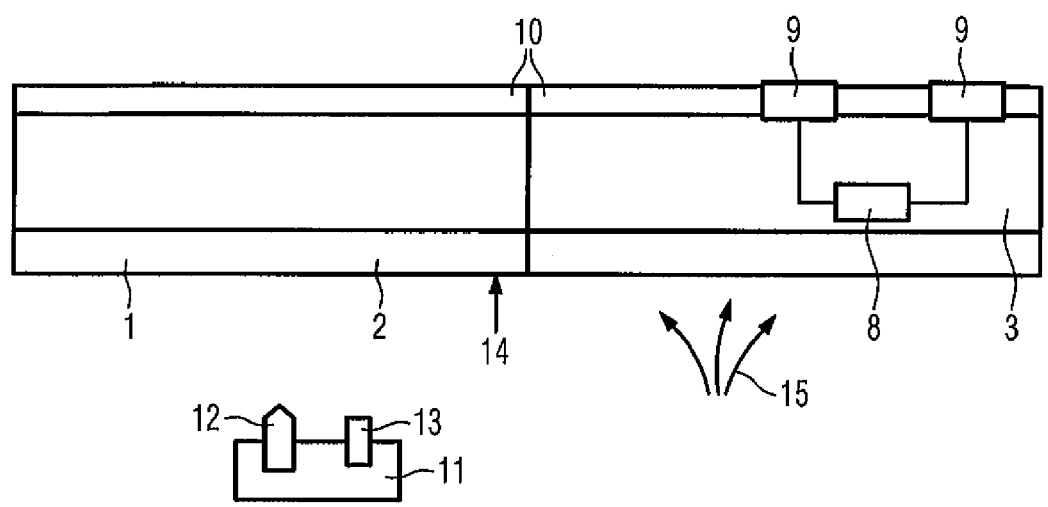
FIG. 2 is a part of a cross section of the integrated circuits on the wafer including a control module.

The process control modules 3 are test devices for measuring electric characteristics of the wafer and may include active or passive electric devices, such as transistors or resistive tracks. A cross section of one of the process control modules 6 is depicted in FIG. 2, which shows schematically an electric process control device 8 which is connected to contact bumps 9 which may be made, for instance, from metal, particularly from gold. For the exemplary embodiment, the integrated circuits 1 and the process control modules 3 are covered by a passivation layer 10. A passivation layer is a sealing layer added at the end of the fabrication process to prevent deterioration of electronic properties of the integrated circuits 1 through chemical action, corrosion, or handling during a packaging process. The passivation layer 10 may comprise silicon dioxide or silicon nitride and may protect against moisture or contamination. The contact bumps 9 are formed into the passivation layer 10.

The optical control modules 6 are alignment marks formed on the wafer substrate 2 and used for automatically aligning a reticle during the process of manufacturing the integrated circuits 1 on the wafer for the exemplary embodiment. The optical control modules 6 may be comprised of square, rectangular or cross-shaped interference fields particularly automatically detectable by a stepper used for the reticle. Automatic alignment utilizing the optical control modules 6 may be accomplished by passing low-energy laser beams through alignment marks on the reticle and reflecting them off corresponding alignment marks, i.e. the optical control modules 6, on the wafer surface. The optical control modules 6 may particularly have a three dimensional structure such that they can be used for each exposure step during the manufacture of the integrated circuits 1 on the wafer substrate 2.

Each process control module 3 is bounded by two consecutive first saw lines 4 and by two consecutive second saw lines 5. Thus, the individual process control modules 6 are formed on the wafer substrate 2 instead of an integrated circuit 1. In addition, each optical control module 6 is also bounded by two consecutive first and two consecutive second saw lines 4, 5, for the exemplary embodiment. Therefore, each optical control module 6 is formed on the wafer substrate 2 instead of an integrated circuit 1.

Figure 3:
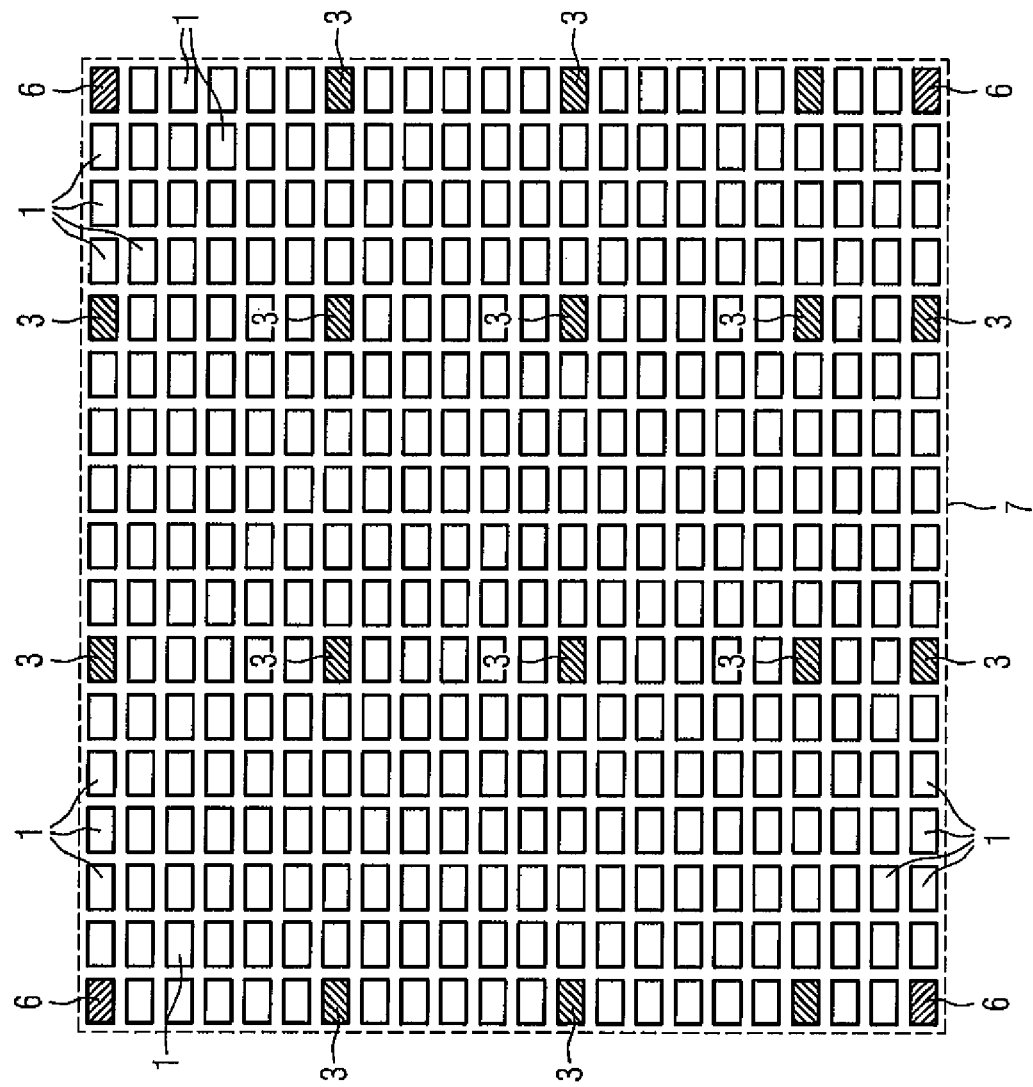
FIG. 3 is an exposure field.

Since for the exemplary embodiment the integrated circuits 1 have been formed on the wafer substrate 2 utilizing the reticle and the stepper, the wafer surface on which the integrated circuits 1, the process control modules 3 and the optical control modules 6 are formed is comprised of several exposure fields 7. FIG. 3 shows one of the exposure fields 7. During manufacturing of the integrated circuits 1 on the wafer substrate 2, an area of the wafer substrate 2 corresponding to the reticle is exposed and then the reticle is moved to a further area of the wafer substrate 2 utilizing the stepper. The area exposed by the reticle is one of the exposure fields 7.

For the exemplary embodiment, the wafer surface is comprised of several exposure fields 7. Each exposure field 7 comprises several of the integrated circuits 1, several process control modules 3, and four optical control modules 6. The optical control modules 6 of each exposure field 7 are placed at the four corners of the relevant exposure field 7.

When the fabrication of the integrated circuits 1 on the wafer is finished, the electric properties of the integrated circuits 1 are tested in a manner per se well known in the art and are registered in working and non-working integrated circuits 1. The registration in working and non-working integrated circuits may be performed utilizing an electronic map 21 corresponding to the matrix-arrangement of the integrated circuits 1 on the wafer, wherein working integrated circuits 1 may be labeled accordingly within the electronic map 21. For instance, working integrated circuits may be labeled by "1" and non-working integrated circuits may be labeled as "0".

Figure 4:
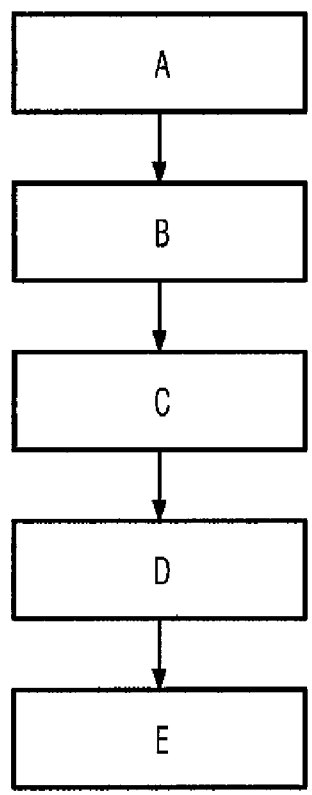
FIG. 4 is a flow chart.

After testing the integrated circuits 1 on the wafer, they will be separated. The separating may, for instance, be performed utilizing an appropriate saw or laser. For the exemplary embodiment, the separation step is carried out as following and is summarized by a flow chart shown in FIG. 4.

For the exemplary embodiment, the process control modules 3 and particularly the contact bumps 9 of the process control modules 3 are used for aligning a separating device 11 which may comprise a laser 12 which is going to be guided on a bottom wafer surface 14 of the wafer substrate 2 along the saw lines 4, 5. The bottom wafer surface 14 is opposite to the surface of the wafer substrate 2 on which the integrated circuits 1, the process control modules 3, and the optical control modules 6 are formed.

In order to be guided accurately along the saw lines 4, 5, the laser 12 is aligned with respect to the wafer substrate 2. For the alignment, the bottom wafer surface 14 is subjected to light 15 which is reflected by the contact bumps 9 of the process control modules 3. The reflected light is detected by an optical sensor 13 of the separating device 11, step A of the flow chart of FIG. 4. Thus, the optical sensor 13 detects the contact bumps 9 of the process control modules 3.

In response to the detected contact bumps 9, the laser 12 can be aligned with respect to the wafer substrate 2, step B of the flow chart.

Then, the aligned laser 12 is guided on the bottom surface 14 along the saw lines 4, 5, step C of the flow chart. After that, the integrated circuits 1 on the wafer are placed on a foil 16 of a film frame carrier 17 shown in FIG. 5. The foil 16 of the film frame carrier 17 is flexible, such that the wafer can be flexed in order to separate the individual integrated circuits 1 by breaking the wafer substrate 2 along the saw lines 4, 5. The wafer substrate 2 may be flexed by utilizing bars as it is per se known in the art, step D of the flow chart of FIG. 4.

After breaking the wafer substrate 2 along the saw lines 4, 5, the foil 16 of the film frame carrier 17 is slightly stretched in order to generate gabs 18 between adjacent separated integrated circuits 1, step E of the flow chart. FIG. 6 depicts a top-view and FIG. 5 a cross section of the separated integrated circuits 1 attached on the foil 16 of the film frame carrier 17.

Figure 5:
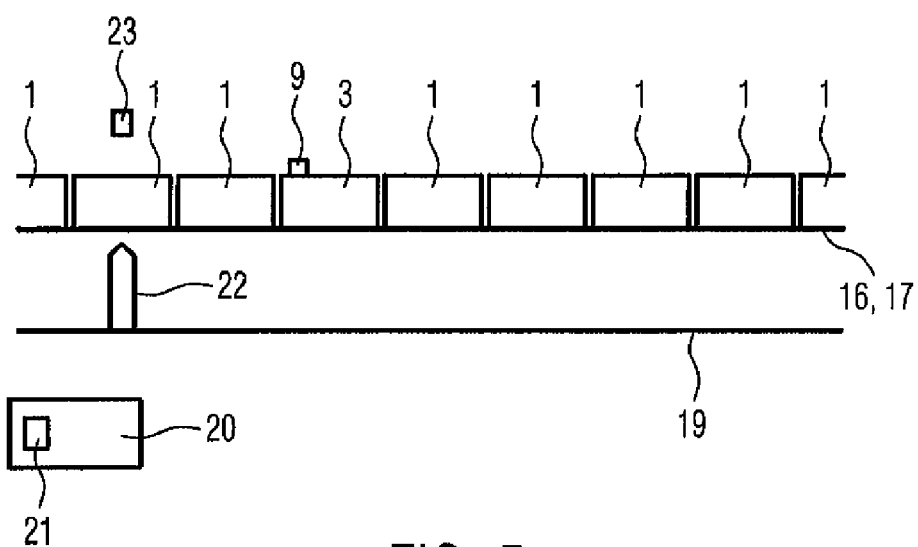
FIG. 5 is a pick-and-place system.
Figure 6:
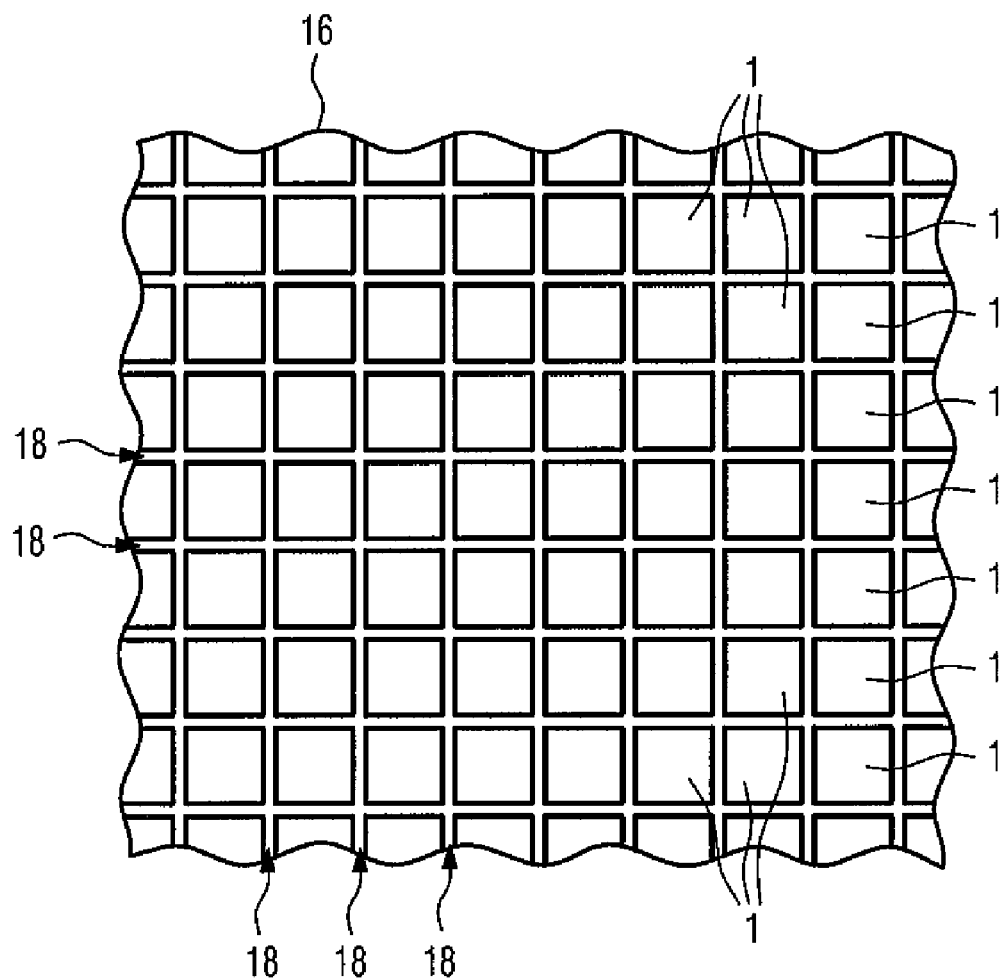
FIG. 6 is a top-view of some of the integrated circuits 1 on a foil of a film frame carrier.

After that, the separated and working integrated circuits 1 are picked up from the film frame carrier 17 utilizing a pick-and-place system 19 shown in FIG. 5.

For the exemplary embodiment, the pick-and-place system 19 is controlled by a computer 20 utilizing the electronic map 21 which indicates which of the integrated circuits 1 are working and which of the integrated circuits 1 are non-working integrated circuits 1. The pick-and-place system 19 comprises a needle 22 which, during the picking up of the working integrated circuits 1, is moved under the relevant integrated circuit 1 and moved up in order to slightly lift the relevant integrated circuit 1. The pick-and-place system 19 further comprises an optical sensor 23 which detects the contact bumps 9 of the process control modules 3. The optical sensor 23 may be mechanically coupled to the needle 22 such that the optical sensor 23 is above and the needle 22 is below an integrated circuit 1 to be picked up.

Finally, it should be noted that the aforementioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method for manufacturing integrated circuits, comprising the steps of:
   providing the integrated circuits on the wafer, the integrated circuits on a wafer comprising:
   a wafer substrate;
   a plurality of integrated circuits formed lattice-like in rows and columns on the wafer substrate;
   first and second saw lines separating the integrated circuits, the first saw lines running parallel and equidistant with respect to each other in a first direction defined by the rows, and the second saw lines running parallel and equidistant with respect to each other in a second direction defined by the columns; and
   a plurality of process control modules formed on the wafer substrate such that a given process control module of the plurality of process modules is bounded by two consecutive first saw lines as well as by two consecutive second saw lines;

detecting the process control modules on the wafer substrate utilizing an alignment detecting device of a separating device;
aligning the separating device in response to the detected process control modules; and
guiding the separating device along the saw lines;
wherein detecting the process control modules includes utilizing light shining through a bottom surface of the wafer substrate, the bottom surface of the wafer substrate being opposite to a surface of the wafer substrate on which the integrated circuits are formed, and wherein the separating device is guided on the bottom surface of the wafer substrate along the saw lines.

2. The method of claim 1, wherein the process control modules are placed in a regular manner on the wafer substrate, wherein between at least two or between all process control modules at least one integrated circuit is placed on the wafer substrate, and/or wherein at least two process control modules are be adjacent to each other.

3. The method of claim 1, further comprising a plurality of rectangular shaped exposure fields, each comprising rows and columns defined by the first and second saw lines, and each comprising some of the integrated circuits and some of the process control modules.

4. The method of claim 3, wherein each exposure field comprises at least one optical control module, and/or four optical control modules located at the corners of the exposure fields.

5. The method of claim 4, wherein each optical control module has the size of one of the integrated circuits and the optical control modules are placed on the wafer substrate instead of integrated circuits.

6. The method of claim 1, wherein the process control modules comprise contact bumps configured to contact electric process control devices of the process control modules; the contact bumps being used for aligning the separating device.

7. A method for manufacturing integrated circuits, comprising the steps of:
providing the integrated circuits on the wafer, the integrated circuits on a wafer comprising:
a wafer substrate;
a plurality of integrated circuits formed lattice-like in rows and columns on the wafer substrate;
first and second saw lines separating the integrated circuits, the first saw lines running parallel and equidistant with respect to each other in a first direction defined by the rows, and the second saw lines running parallel and equidistant with respect to each other in a second direction defined by the columns; and
a plurality of process control modules formed on the wafer substrate such that a given process control module of the plurality of process modules is bounded by two consecutive first saw lines as well as by two consecutive second saw lines;
detecting the process control modules on the wafer substrate utilizing an alignment detecting device of a separating device;
aligning the separating device in response to the detected process control modules; and
guiding the separating device along the saw lines;
wherein the process control modules comprise contact bumps configured to contact electric process control devices of the process control modules; the contact bumps being used for aligning the separating device.

8. The method of claim 7, wherein the process control modules are placed in a regular manner on the wafer substrate, wherein between at least two or between all process control modules at least one integrated circuit is placed on the wafer substrate, and/or wherein at least two process control modules are be adjacent to each other.

9. The method of claim 7, further comprising a plurality of rectangular shaped exposure fields, each comprising rows and columns defined by the first and second saw lines, and each comprising some of the integrated circuits and some of the process control modules.

10. The method of claim 9, wherein each exposure field comprises at least one optical control module, and/or four optical control modules located at the corners of the exposure fields.

11. The method of claim 10, wherein each optical control module has the size of one of the integrated circuits and the optical control modules are placed on the wafer substrate instead of integrated circuits.

12. The method of claim 7, wherein the process control modules comprise contact bumps configured to contact electric process control devices of the process control modules; the contact bumps being used for aligning the separating device.

* * * * *